(12) United States Patent
Deng et al.

(10) Patent No.: US 7,952,099 B2
(45) Date of Patent: May 31, 2011

(54) THIN FILM TRANSISTOR LIQUID CRYSTAL DISPLAY ARRAY SUBSTRATE

(75) Inventors: Chaoyong Deng, Beijing (CN); Seung Moo Rim, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 781 days.

(21) Appl. No.: 11/737,954

(22) Filed: Apr. 20, 2007

(65) Prior Publication Data

US 2007/0246707 A1    Oct. 25, 2007

(30) Foreign Application Priority Data

Apr. 21, 2006 (CN) ............................ 2006 1 0074457
May 23, 2006 (CN) ............................ 2006 1 0080641

(51) Int. Cl.
*H01L 27/14* (2006.01)
(52) U.S. Cl. ........................................... 257/72; 257/66
(58) Field of Classification Search .................... 257/66, 257/72
See application file for complete search history.

(56) References Cited

U.S. PATENT DOCUMENTS

| | | | |
|---|---|---|---|
| 5,173,753 A | 12/1992 | Wu | |
| 5,473,168 A | 12/1995 | Kawai et al. | |
| 5,771,083 A | 6/1998 | Fujihara et al. | |
| 5,818,549 A | 10/1998 | Maruyama et al. | |
| 6,531,392 B2 | 3/2003 | Song et al. | |
| 6,649,934 B2 | 11/2003 | Song et al. | |
| 6,800,872 B2 | 10/2004 | Tanaka et al. | |
| 2002/0085157 A1 * | 7/2002 | Tanaka et al. | 349/147 |
| 2004/0263742 A1 | 12/2004 | Kim | |
| 2005/0046784 A1 | 3/2005 | Chae | |
| 2006/0027810 A1 * | 2/2006 | Machida et al. | 257/66 |
| 2007/0272926 A1 | 11/2007 | Deng | |
| 2007/0298554 A1 | 12/2007 | Long | |
| 2008/0030639 A1 | 2/2008 | Qiu | |

(Continued)

FOREIGN PATENT DOCUMENTS

JP    63-119577 A    5/1988

(Continued)

OTHER PUBLICATIONS

U.S. Appl. No. 11/958,613, filed Dec. 18, 2007, Zhangtao Wang.

(Continued)

*Primary Examiner* — N Drew Richards
*Assistant Examiner* — Jae Lee
(74) *Attorney, Agent, or Firm* — Hasse & Nesbitt LLC; Daniel F. Nesbitt

(57) ABSTRACT

A TFT LCD array substrate and a manufacturing method thereof. The manufacturing method includes the steps of: forming a thin film transistor on a substrate to form a gate line and a gate electrode connected with the gate line on the substrate; forming a gate insulating layer and a semiconductor layer on the gate electrode; forming an ohmic contact layer on the semiconductor layer; forming a transparent pixel electrode layer and a source/drain electrode metal layer in sequence on the resultant substrate, wherein the transparent pixel electrode layer is electrically insulated from the gate line and the gate electrode, and the transparent pixel electrode layer forms an ohmic contact with two sides of the semiconductor layer via the ohmic contact layer; and performing masking and etching with a gray tone mask with respect to the resultant substrate to form a transparent pixel electrode, a source/drain electrode and a data line simultaneously.

9 Claims, 11 Drawing Sheets

U.S. PATENT DOCUMENTS

| | | |
|---|---|---|
| 2008/0061295 A1 | 3/2008 | Wang |
| 2008/0100766 A1 | 5/2008 | Ming |
| 2008/0105873 A1 | 5/2008 | Wang |
| 2008/0105874 A1 | 5/2008 | Wang |
| 2008/0111136 A1 | 5/2008 | Qiu |
| 2008/0111934 A1 | 5/2008 | Wu |
| 2008/0117347 A1 | 5/2008 | Zhang |
| 2008/0123007 A1 | 5/2008 | Cui |
| 2008/0123030 A1 | 5/2008 | Song |
| 2008/0142802 A1 | 6/2008 | Qiu |
| 2008/0142819 A1 | 6/2008 | Liu |

FOREIGN PATENT DOCUMENTS

| | | |
|---|---|---|
| JP | 3-142842 | 6/1991 |
| JP | 6-326314 | 11/1994 |
| JP | 8313934 | 11/1996 |
| JP | 9-292629 | 11/1997 |
| JP | 11-326950 | 11/1999 |
| JP | 2000-101091 | 4/2000 |
| JP | 2001-311965 | 11/2001 |
| JP | 2005-108912 | 4/2005 |

OTHER PUBLICATIONS

U.S. Appl. No. 11/958,634, filed Dec. 18, 2007, Chunping Long.

U.S. Appl. No. 12/104,575, filed Apr. 17, 2008, Xinxin Li.

JPO2007-113400-Office Action dated Jan. 27, 2011—4 pages in Japanese with 3 page English translation of indicated portions and Claims (4 pages in Japanese with 5 page English translation).

* cited by examiner

THIN FILM TRANSISTOR LIQUID CRYSTAL DISPLAY ARRAY SUBSTRATE

FIELD OF THE INVENTION

The present invention relates to a thin film transistor liquid crystal display (TFT LCD) array substrate and a manufacturing method thereof, and more particularly, to a TFT LCD array substrate manufactured with photolithography processes using reduced number of masks and a manufacturing method thereof.

BACKGROUND OF THE INVENTION

As one important type of flat plate display, a LCD, such as TFT LCD, has been developing rapidly in the last decade and has attracted the attention. Due to intensive competition among the manufactures and advancement in manufacturing technology of TFT LCD, LCDs with excellent display performance and lower price have been increasingly put into market. Therefore, introduction of more advanced manufacturing technology to simplify the production process and reduce the production cost has become an important guarantee for the manufacturer to survive in the intensive competition.

The manufacturing technology for TFT LCD array substrate has undergone the map from the seven mask (7Mask) technology to the current five mask (5Mask) technology, and the 5Mask technology today has become the mainstream for manufacturing TFT LCD array substrate.

Some manufacturers have attempted to exploit the four mask (4Mask) technology in fabrication. This 4Mask technology is based on the previous 5Mask technology, in which the mask for forming active layer (Active Mask) and the mask for forming source/drain electrode (S/D Mask) are merged into a single one with the aid of gray tone mask, and the functions of the original two masks, i.e., Active Mask and S/D Mask, are achieved by the single mask through modification to the etching processes.

Gray tone mask has a slit-shaped pattern thereon, and partially transparent patterned regions are formed on the mask due to the interference and diffraction of light passing the patterned regions of the mask. During exposure, the light only partially passes through the partially transparent portions. By controlling the exposure quantity, light passing through the partially transparent portions illuminates portions of photoresist and has the portions partially exposed, and the light passing through the remaining fully transparent portions of the mask illuminates the other portions of the photoresist and has these portions fully exposed. After developing, no photoresist exists in the fully exposed regions, and photoresist thickness in the partially exposed regions is less than that in the non-exposed regions, so that the exposed photoresist is shaped in three-dimension. The photoresist thickness can be controlled by controlling the transmittance ratio among the regions of the gray tone mask, i.e. the "duty ratio" of the slit region to the empty region. The method of forming a three-dimensional pattern with different thickness on the photoresist through a mask with partially transparent pattern is collectively called gray tone mask technology.

The conventional 5Mask technology uses five masks for photolithography, including the masks for forming gate electrode (Gate Mask), active layer (Active Mask), source/drain electrode (S/D Mask), via hole (Via Hole Mask), and pixel electrode (Pixel Mask), respectively. The processes using the respective masks further include one or more thin film deposition and etching process (e.g., dry etching or wet etching process), thus resulting in five cycles of thin film deposition, photolithography, and etching processes, as shown in FIG. 2.

A typical pixel unit of a TFT LCD array substrate manufactured by the above conventional 5Mask technology is shown in FIG. 1.

SUMMARY OF THE INVENTION

In line with the trend of the art, the present invention provides a TFT LCD array substrate and the manufacturing method thereof, which reduces the photolithography using mask so as to reduce the process steps, improve the production capacity and decrease the cost, and also improves the utilization ratio of the equipment, reduces the process time and improves the yield.

In order to achieve the above objects, according to one aspect of the present invention, there is provided a TFT LCD array substrate, comprising: a substrate and a pixel array on the substrate, each pixel comprising: a gate line and a gate electrode connected with the gate line formed on the substrate; a gate insulating layer formed on the gate electrode; a semiconductor layer formed on the gate insulating layer and an ohmic contact layer formed on the semiconductor layer; a transparent pixel electrode formed on the semiconductor layer and the ohmic contact layer; a source/drain electrode formed on the transparent pixel electrode and data line connected with the source/drain electrode; and a passivation layer formed on the source/drain electrode, the data line and the transparent pixel electrode, wherein, the transparent pixel electrode establishes an ohmic contact with the semiconductor layer via the ohmic contact layer over two sides of the semiconductor layer.

According to another aspect of the present invention, there is provided a method of manufacturing the above TFT LCD array substrate, comprising: step 1 of depositing a gate metal layer on a substrate and then performing masking and etching to obtain a gate line and a gate electrode connected with the gate line; step 2 of depositing a gate insulating layer, an semiconductor layer, and an ohmic contact layer on the resultant substrate after step 1 and then performing masking and etching to form the thin film transistor; step 3 of depositing a transparent pixel electrode layer and a source/drain electrode layer on the resultant substrate after step 2 and then performing masking with a gray tone mask to form a transparent pixel electrode, a source/drain electrode, and a channel for the TFT; and, step 4 of depositing a passivation layer on the resultant substrate after step 3, and then performing masking and etching to form via holes and provide protection for the channels, with pad being exposed therein.

With the above method, a TFT LCD array substrate can be obtained with a 4Mask method, which can be realized with fewer steps, lower production cost, and higher yield compared with the conventional 5Mask process. Furthermore, by merging the mask for the source/drain electrode and mask for transparent pixel electrode into a single one, the source/drain metal layer and the transparent layer can be deposited sequentially in the same sputter, and the yield and utilization ratio of the sputter can be improved.

According to yet another aspect of the present invention, there is provided another TFT LCD array substrate, comprising: a substrate and a pixel array on the substrate, each pixel comprising: a gate line and a gate electrode connected with the gate line, formed on the substrate; a gate insulating layer formed on the gate electrode and a semiconductor layer formed on the gate insulating layer; and an isolating dielectric layer covering the substrate, the gate line, the gate electrode, the gate insulating layer and the semiconductor layer, wherein via holes, in which an ohmic contact layer is deposited, are formed on both sides of the isolating dielectric layer over the semiconductor layer, a transparent pixel electrode formed on the isolating dielectric layer and establishing an ohmic contact with the semiconductor layer via the ohmic contact layer in the via holes, and a source electrode, a drain electrode and a data line formed on the transparent pixel electrode.

According to yet another aspect of the present invention, there is provided a method of manufacturing the above TFT LCD array substrate, comprising: step 1 of depositing a gate metal layer, a gate insulating dielectric layer and a semiconductor layer on a substrate, and then performing masking and etching by a gray tone mask to form a gate line, a gate electrode connected with the gate line, a gate insulating layer, and a semiconductor layer for a thin film transistor; step 2 of depositing an isolating dielectric layer on the resultant substrate after step 1, and then performing masking and etching process with respect to the isolating dielectric layer to form via holes in the isolating dielectric layer on both sides of the semiconductor layer; step 3 of forming an ohmic contact layer in the via holes obtained in step 2; and step 4 of depositing a pixel electrode layer and a source/drain electrode metal layer on the resultant substrate after step 3, then performing masking and etching with a gray tone mask to form a transparent pixel electrode, a source electrode, a drain electrode and a data line, wherein the drain electrode is integrated with the data line.

With the above method, the masks used for fabrication of a TFT LCD array substrate can be further reduced, and only three masks are possibly used to obtain the TFT LCD array substrate. This 3Mask method go forward with less steps, lower production cost and higher yield compared with the conventional manufacturing process. Furthermore, by merging the mask for the source/drain electrode and mask for transparent pixel electrode, the source/drain metal layer and the transparent pixel electrode layer can be deposited sequentially in the same sputter equipment, and the yield and utilization ratio of the sputter can be improved.

Further, according to still another aspect of the present invention, there is provided a TFT LCD array substrate, comprising: a substrate and a pixel array on the substrate, each pixel comprising: a thin film transistor formed on the substrate, including a gate line and a gate electrode connected with the gate line formed on the substrate, a gate insulating layer formed on the gate electrode, a semiconductor layer, and an ohmic contact layer formed on at least two ends of the semiconductor layer; a transparent pixel electrode formed on the transistor, electrically insulated from the gate electrode and the gate line, and electrically contacted with the two ends of the semiconductor layer respectively via the ohmic contact layer; and a source/drain electrode and a data line formed on the transparent pixel electrode and electrically connected with the semiconductor layer with the transparent pixel electrode.

According to still another aspect of the present invention, there is provided a method of manufacturing the above TFT LCD array substrate, comprising: forming a thin film transistor on a substrate so that forming a gate line and a gate electrode connected with the gate line on the substrate, a gate insulating layer, a semiconductor layer on the gate electrode, and an ohmic contact layer on the semiconductor layer; forming a transparent pixel electrode layer and a source/drain electrode metal layer in sequence on the resultant substrate, wherein the transparent pixel electrode layer is electrically insulated from the gate line and the gate electrode, and the transparent pixel electrode layer forms an ohmic contact with two sides of the semiconductor layer via the ohmic contact layer; and performing masking and etching with a gray tone mask with respect to the resultant substrate to form a transparent pixel electrode and a source/drain electrode simultaneously, wherein the partially transparent portion of the gray tone mask corresponds to the transparent pixel electrode, the opaque portion of the gray tone mask to the source/drain electrode and the data line, and the completely transparent portion of the gray tone mask to the remaining portion of the substrate.

BRIEF DESCRIPTION OF THE DRAWINGS

The present invention will be described in detail with reference to the accompanying drawings which illustrate the preferred embodiments of the present invention, in which.

DESCRIPTION OF THE PREFERRED EMBODIMENTS

The following is provides for convenience in identifying the elements of the drawings:
- 1: substrate
- 2: gate line and gate electrode
- 3: gate insulating layer
- 4: semiconductor layer
- 15: ohmic contact layer
- 5: pixel electrode
- 6: source/drain electrode (data line)
- 7: passivation layer
- 9: high temperature photoresist
- 10: Mo (W, Cr, or alloys thereof) layer
- 17: isolating dielectric layer Hereinafter, the present invention will be described more fully by reference to the accompanying drawings, in which the preferred embodiments of the present invention are illustrated. However, the present invention can be carried out in many ways, and should not be construed to be limited to the preferred embodiments illustrated herein. On the contrary, these embodiments are provided to make the disclosure more sufficient and complete, and fully convey the scope of the present invention to those skilled in the art.

The First Embodiment

Figure 1:
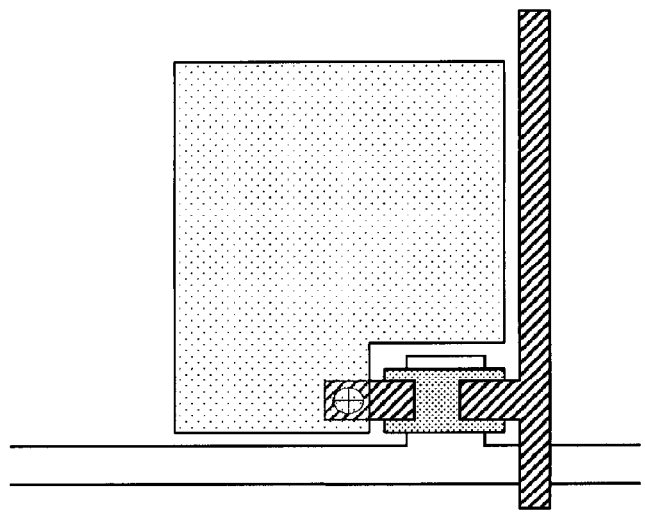
FIG. 1 is a plan view of a typical pixel unit of a TFT LCD array substrate.
Figure 2:
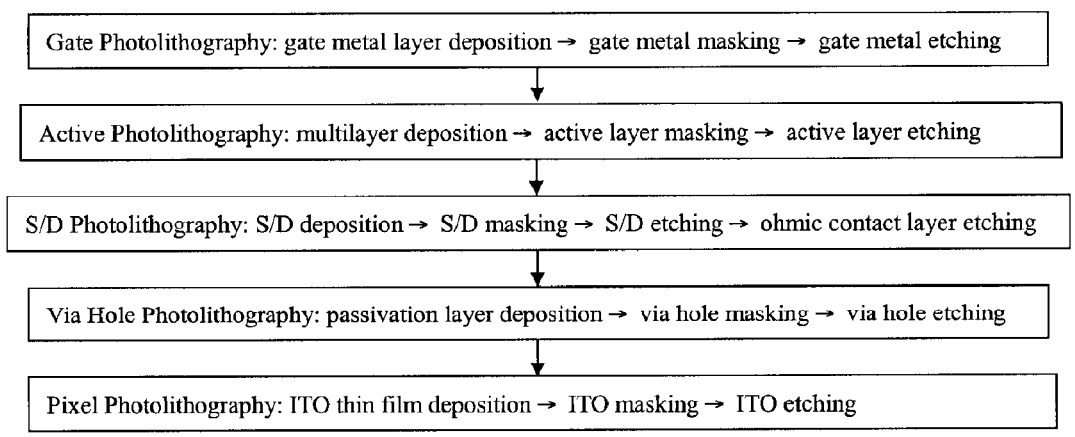
FIG. 2 is the conventional 5Mask method's flowchart.
Figure 3:
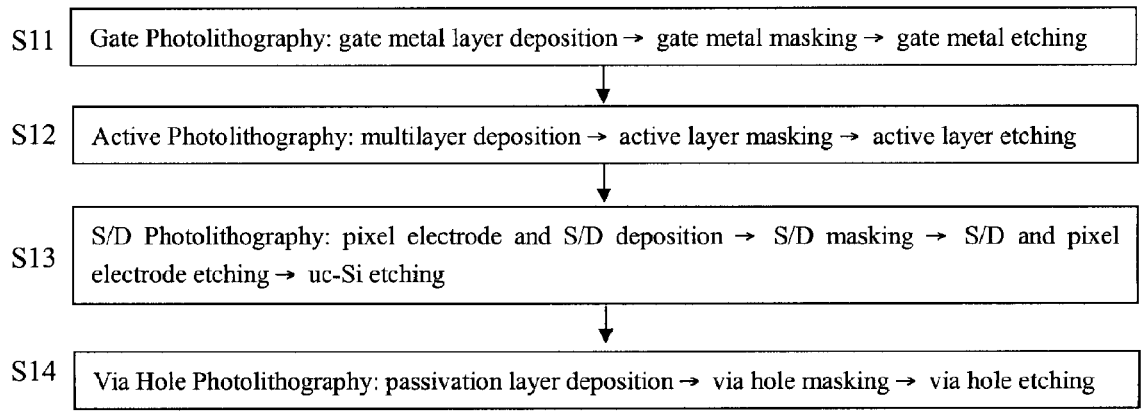
FIG. 3 is the flowchart in accordance with the first embodiment of the present invention.

FIG. 3 illustrates the detailed flowchart for the method of manufacturing a TFT LCD array substrate in accordance with the first embodiment of the present invention, which includes the following steps.

Figure 6A:
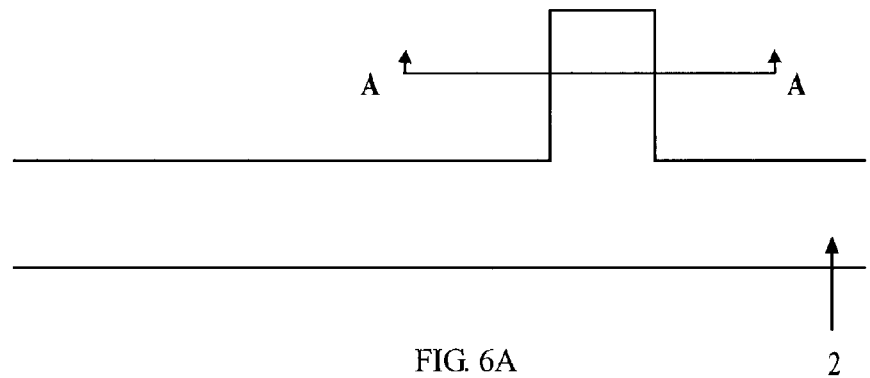
FIG. 6A is a plan view illustrating a stage after the Gate Mask of step 1 (S11) in accordance with the first embodiment.
Figure 6B:
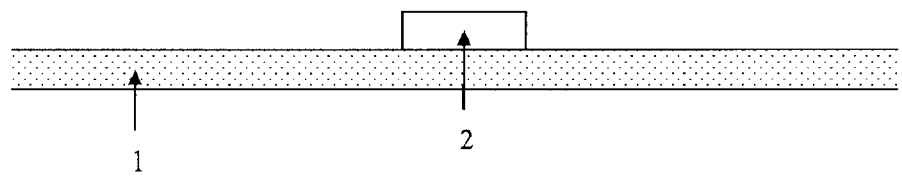
FIG. 6B is a cross-sectional view along the line A-A in FIG. 6A.

In Step 1 (S11), on a substrate 1 such as a glass substrate, a gate metal layer such as Mo/AlNd/Mo (400 Å/4000 Å/600 Å) laminate layer is deposited for example by magnetron sputtering. Then, a masking (Gate Mask) is performed on the gate metal layer, and a wet etching is performed to form a gate line (not shown) and gate electrode 2, as shown in FIGS. 6A and 6B.

Alternatively, the gate metal layer deposited in this step can be a single layer of AlNd, Al, Cu, Mo, MoW or Cr, and can also be a composite film composed of any combination of AlNd, Al, Cu, Mo, MoW, and Cr, for example, metallic composite film of Mo/AlNd/Mo or AlNd/Mo.

Figure 7A:
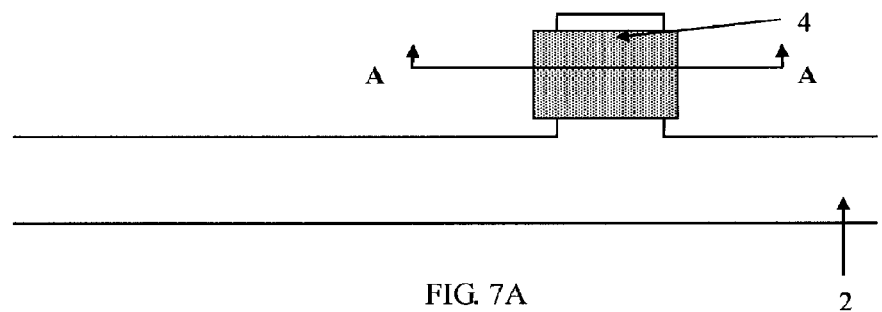
FIG. 7A is a plan view illustrating a stage after the Active Mask of step 2 (S12) in accordance with the first embodiment.
Figure 7B:
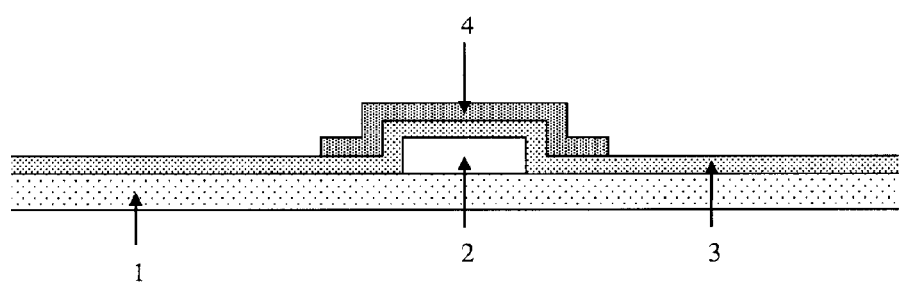
FIG. 7B is a cross-sectional view along the line A-A in FIG. 7A.

In Step 2 (S12), on the resultant substrate after etching the gate metal layer, a gate insulating layer 3, a semiconductor layer (active layer) 4, and an ohmic contact layer (i.e., SiNx/a-Si/μc-Si (5000 Å/2000 Å/500 Å) layers) are deposited in sequence by plasma enhanced chemical vapor deposition (PECVD) process. Here, in order to ensure the ohmic contact between the semiconductor layer and a transparent pixel electrode to be formed later, microcrystal silicon (μc-Si) material is used for the ohmic contact layer instead of $n^+$a-Si. Then a masking (Active Mask) is performed on the active layer, and an etching is performed to form the active layer of the TFT, as shown in FIGS. 7A and 7B (the ohmic contact layer of μc-Si is not shown). The microcrystal silicon material is for example phosphor (P)-doped microcrystal silicon, i.e., $n^+$μc-Si, so as to achieve better electrical conductivity.

Alternatively, the gate insulating layer in this step can be a single layer of SiNx, SiOx, or SiOxNy, or a composite film composed of any combination of SiNx, SiOx, and SiOxNy.

Figure 8A:
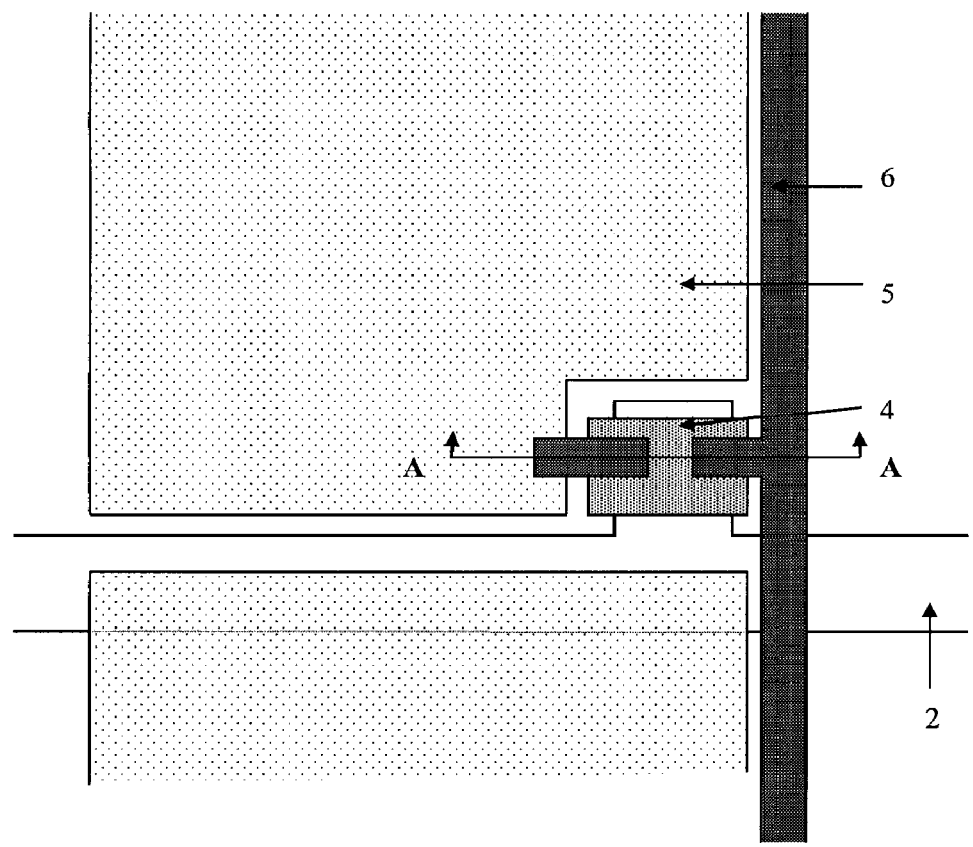
FIG. 8A is a plan view illustrating a stage after G/T S/D Mask.
Figure 8B:
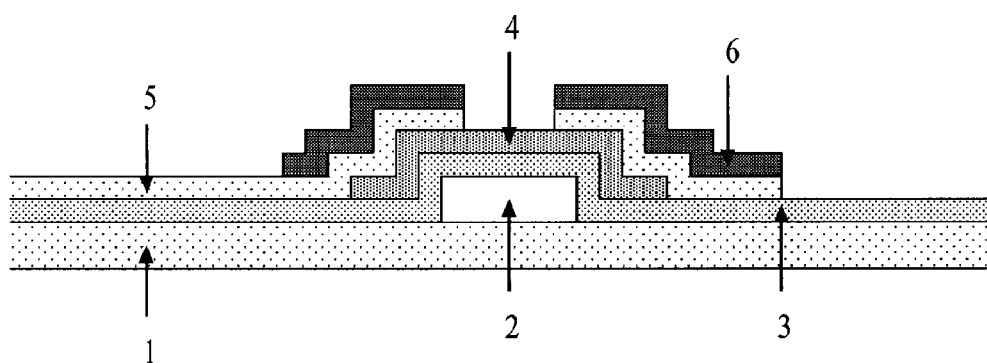
FIG. 8B is a cross-sectional view along the line A-A in FIG. 8A.

In Step 3 (S13), a transparent pixel electrode layer (e.g., ITO of 500 Å) and source/drain electrode layer (e.g., Mo of 3000 Å) are deposited sequentially by magnetron sputtering. Then, a mask is applied under the gray tone mask technology on the resultant substrate, wherein the portion of the mask corresponding to the transparent pixel electrode to be formed is partially transparent, the portion of the mask corresponding to the source/drain electrode and the data line to be formed is opaque, and the remaining portion of the mask is transparent, so that a three-dimensional mask is formed on the substrate by exposing and developing photoresist. With the three-dimensional mask formed after exposing and developing, an etching (G/T S/D etching) for the transparent pixel electrode and the source/drain electrode and an etching for ohmic contact layer μc-Si are performed in order to form the transparent pixel electrode, source/drain electrode, and data lines, while forming the channel for the TFT, as shown in FIGS. 8A and 8B (μc-Si in the channel is not shown). In this step, the source/drain electrode layer and the transparent pixel electrode layer can be deposited sequentially in the same sputter, so that not only the yield but also the utilization ratio of the sputter can be improved.

Alternatively, the source/drain electrode layer can be a single layer of Mo, MoW, or Cr, or a composite film composed of any combination of Mo, MoW, and Cr. The source/drain electrode layer and the transparent pixel electrode layer can be deposited sequentially in different sputter.

Figure 9A:
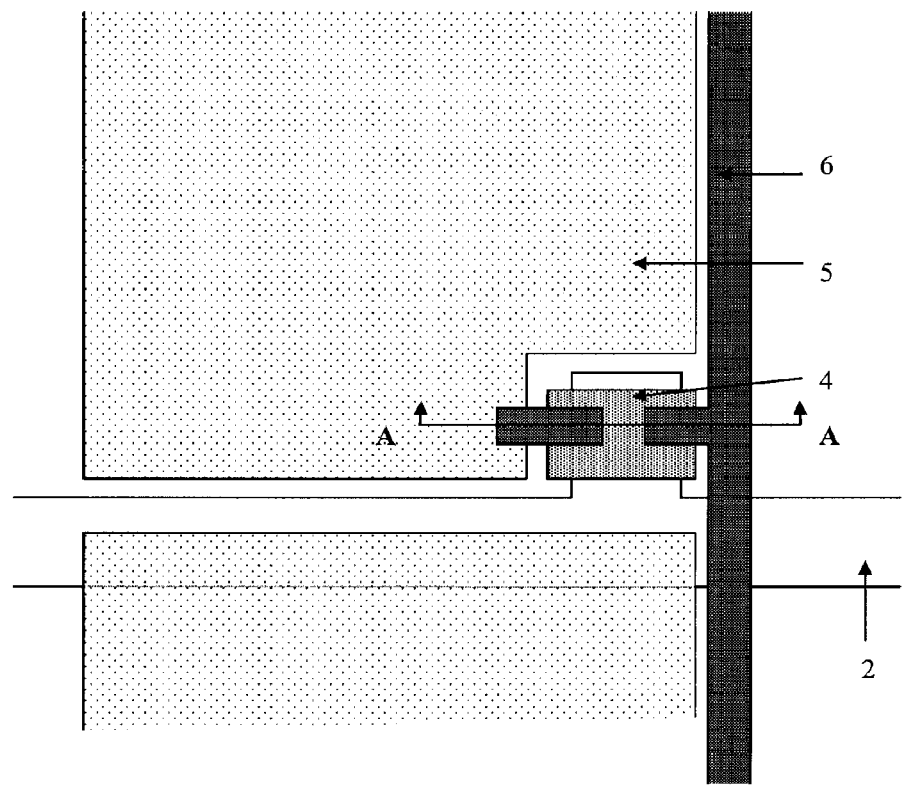
FIG. 9A is a plan view illustrating a stage after the Via Hole Mask.
Figure 9B:
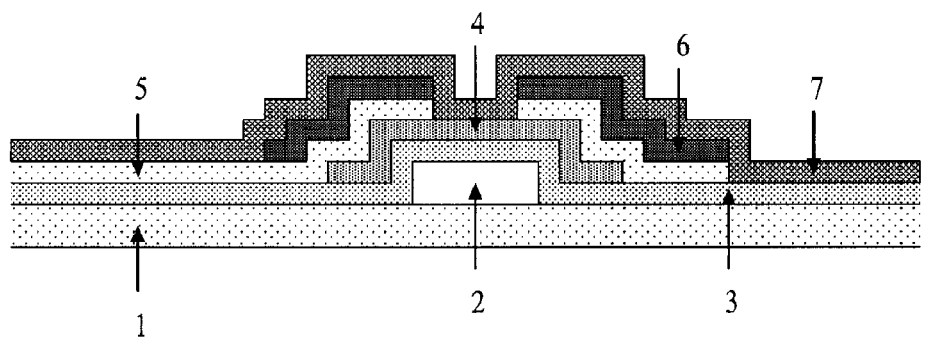
FIG. 9B is a cross-sectional view along the line A-A in FIG. 9A.

In Step 4 (S14), a passivation layer 7 is deposited by PECVD to a thickness of about 2600 Å on the substrate. Then masking and etching for the passivation layer 7 are performed sequentially, so as to form via holes and provide protection for the channel, with the pad being exposed, as shown in FIGS. 9A and 9B.

The first embodiment of the present invention provides a novel 4Mask process for manufacturing a TFT LCD array substrate, which is different from the existing 5Mask and 4Mask processes. With the inventive 4Mask process of the embodiment, a complete TFT array substrate can be obtained with less steps, lower production cost and higher yield. Meanwhile, by depositing the source/drain metal layer and the transparent pixel electrode layer sequentially in the same sputter, the yield and utilization ratio of the sputter can be improved.

Figure 4:
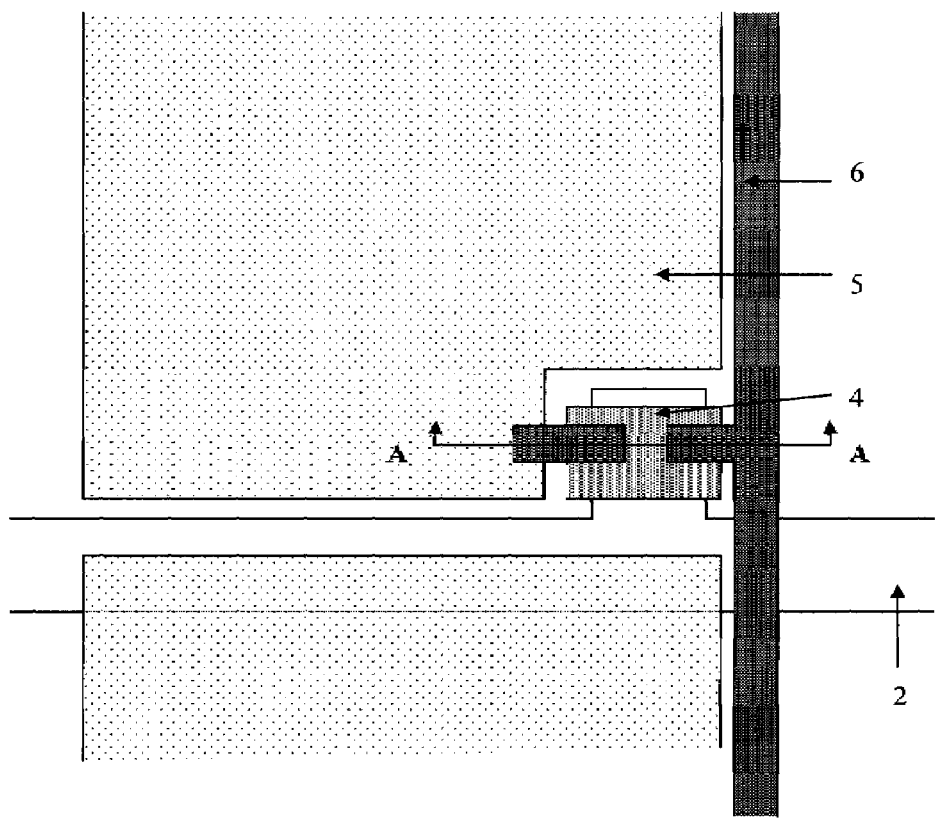
FIG. 4 is a plan view showing a typical pixel unit of a TFT LCD array substrate obtained in accordance with the first embodiment of the present invention.
Figure 5:
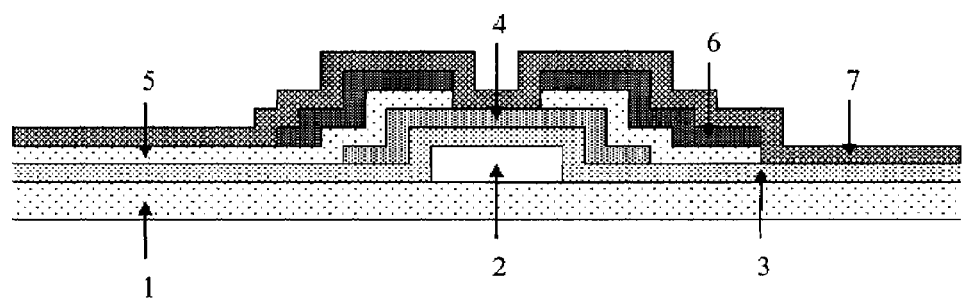
FIG. 5 is a cross-sectional view along the line A-A in FIG. 4.

Furthermore, the first embodiment provides a TFT LCD array substrate, as shown in FIGS. 4 and 5. The TFT LCD array substrate includes a substrate 1, a gate line and a gate electrode 2 formed on the substrate 1, an gate insulating layer 3 formed on the gate electrode 2, a semiconductor layer 4 and an ohmic contact layer on the semiconductor layer 4, a transparent pixel electrode 5, a source/drain electrode 6 and a data line, and a passivation layer 7. Herein, the ohmic contact layer is comprised of P-doped μc-Si material, and the transparent pixel electrode 5 is provided above the ohmic contact layer in the source/drain region on the two sides of the semiconductor layer 4. An ohmic contact is achieved via the μc-Si material, and the source/drain electrode is formed over the transparent pixel electrode 5.

This embodiment only presents a specific solution for realizing the present invention, but the device configuration and the process conditions in this embodiment can be varied if desired. For example, a negative photoresist can be used, the structure and thickness of individual layers can be changed, other methods of physical vapor deposition (PVD) such as evaporation, electron beam evaporation, plasma spray and the like, and chemical deposition methods such as atmospheric pressure CVD and the like can be employed, and dry etching such as plasma etching, reactive ion etching (RIE) and the like can be used. The specific process conditions of these methods can be varied depending on the specific requirements during manufacturing the LCD, but these variations do not depart from the spirit and scope of sequentially depositing the transparent pixel electrode layer and the source/drain electrode layer and forming the transparent pixel electrode and source/drain electrode with the same gray tone mask.

The Second Embodiment

Figure 10:
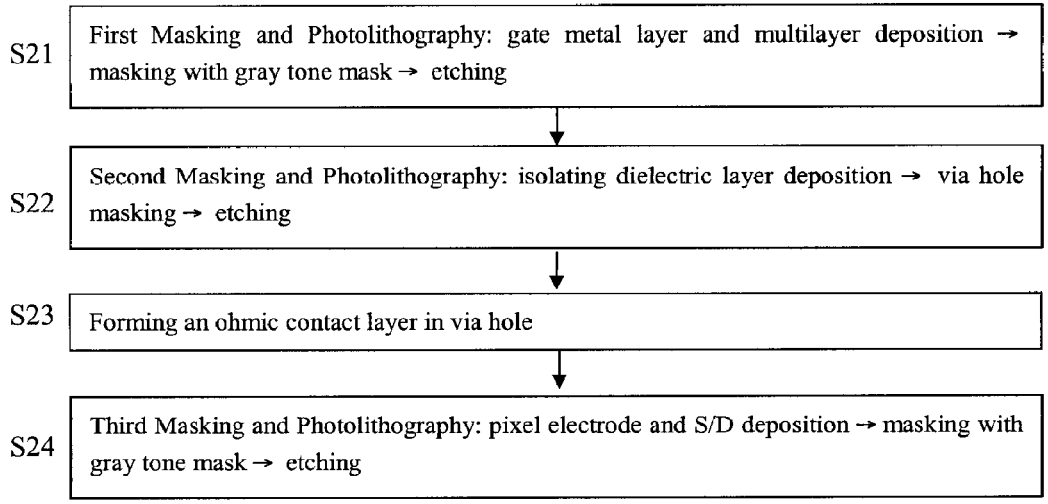
FIG. 10 is the flowchart in accordance with the second embodiment of the present invention.

FIG. 10 illustrates the detailed flowchart for the manufacturing method of a TFT LCD array substrate in accordance with the second embodiment of the present invention, which includes the following steps.

Figure 13A:
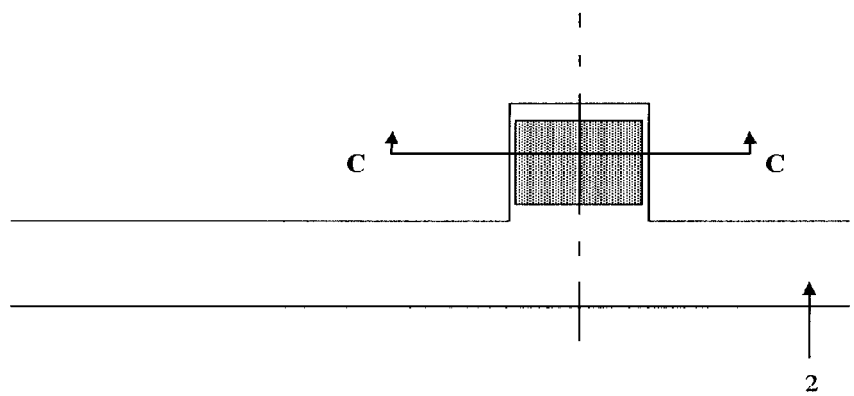
FIG. 13A is a plan view illustrating a stage after the first masking with a gray tone mask and etching in accordance the second embodiment of the present invention.
Figure 13B:
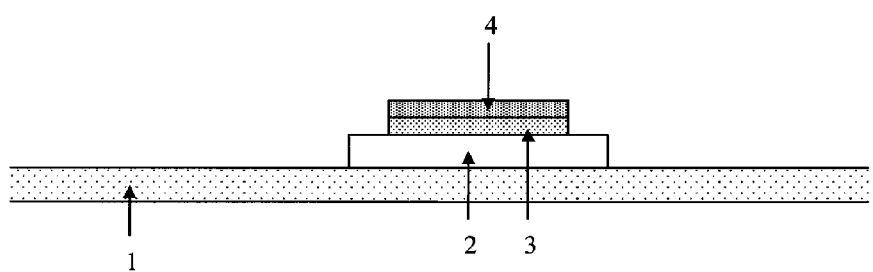
FIG. 13B is a cross-sectional view along the line C-C in FIG. 13A.

In Step 1 (S21), a gate metal layer is deposited on a clean glass substrate by sputtering. Then, a gate insulating layer and a semiconductor layer are deposited in sequence by plasma enhanced chemical vapor deposition (PECVD) method. The gate line and gate electrode as well as the gate insulating layer and semiconductor layer of the TFT are obtained, with a gray tone mask, in which the partially transparent portion of the mask corresponds to the gate line and gate electrode to be formed, the opaque portion of the mask corresponds to the semiconductor layer of the TFT to be formed, and the transparent portion of the mask corresponds to the remaining portion of the substrate, by exposing, developing, and etching, as shown in FIGS. 13A and 13B.

The gate metal layer deposited in this step can be a single layer of AlNd, Al, Cu, Mo, MoW or Cr, and can also be a composite film composed of any combination of AlNd, Al, Cu, Mo, MoW, and Cr. The gate insulating layer deposited in the step can be a single layer of SiNx, SiOx, or SiOxNy, or a composite film composed of any combination of SiNx, SiOx, and SiOxNy.

Figure 14A:
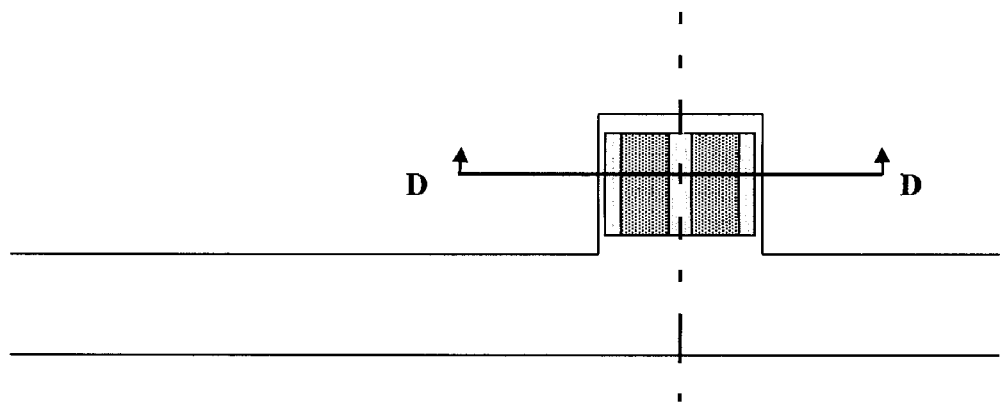
FIG. 14A is a plan view illustrating a stage after the Via Hole masking and etching in accordance with the second embodiment of the present invention.
Figure 14B:
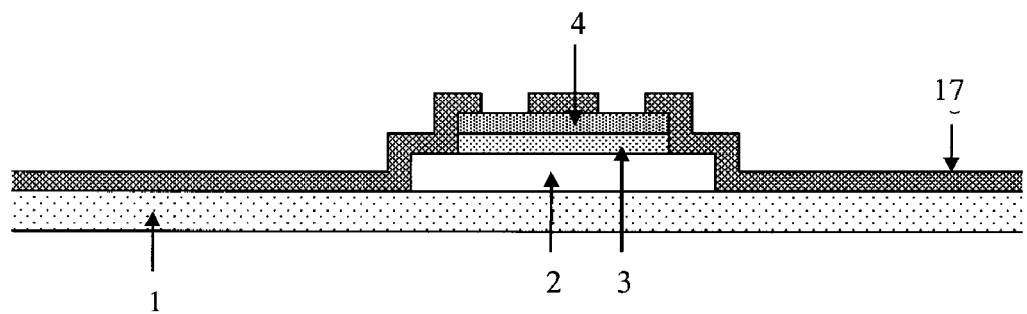
FIG. 14B is a cross-sectional view along the line D-D in FIG. 14A.

In Step 2 (S22), on the resultant substrate of the previous step, an isolating dielectric layer is deposited for example by plasma enhanced chemical vapor deposition (PECVD). Then masking and etching processes are carried out to obtain via holes on both sides of the semiconductor layer of the TFT respectively, which are prepared for ohmic contact between the pixel electrode layer and the semiconductor layer, as shown in FIGS. 14A and 14B.

The isolating dielectric layer deposited in this step can be a single layer of SiNx, SiOx, or SiOxNy, or a composite film composed of any combination of SiNx, SiOx, and SiOxNy.

Then, in Step 3 (S23), an ohmic contact layer is formed in the via holes made in the previous step.

Figure 15A:
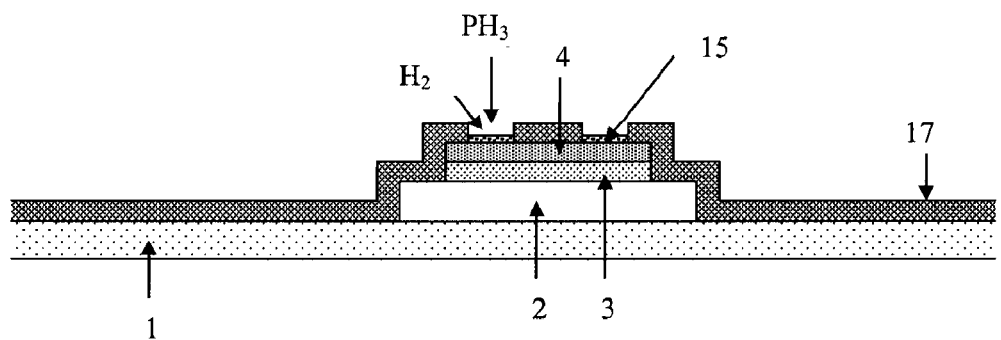
FIG. 15A is a cross-sectional view showing an ohmic contact layer formed by the first approach in accordance with the second embodiment of the present invention.
Figure 15B:
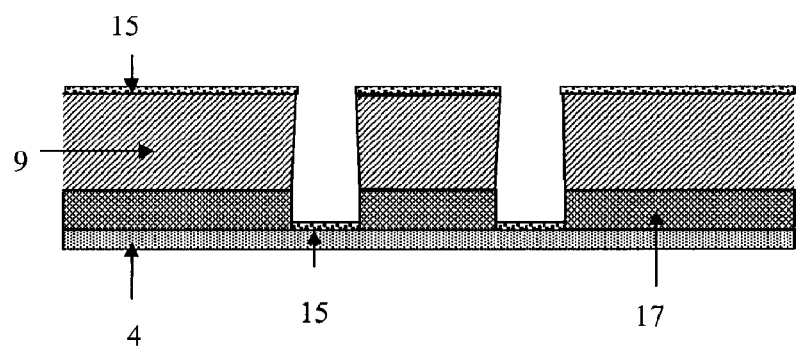
FIG. 15B is a cross-sectional view showing an ohmic contact layer formed by the second approach in accordance with the second embodiment of the present invention.
Figure 15C:
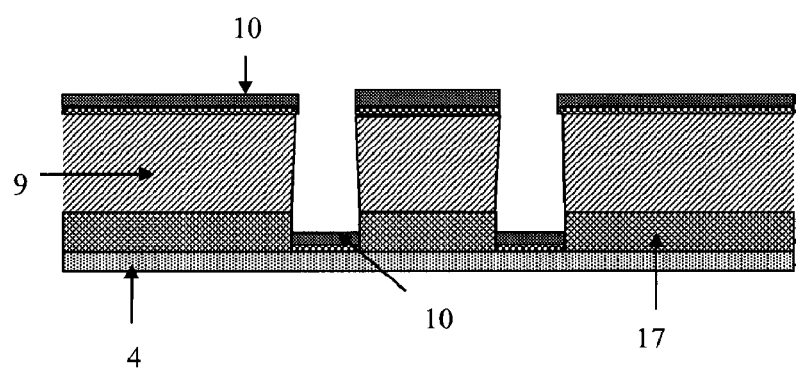
FIG. 15C is a cross-sectional view showing an ohmic contact layer formed by the third approach in accordance with the second embodiment of the present invention.

The ohmic contact between the pixel electrode (as well as the source/drain electrode) and the semiconductor layer can be realized in many approaches, as long as an ohmic contact can be formed in the via holes. FIGS. 15A-15C illustrate three different approaches respectively as follows.

In the first approach, as shown in FIG. 15A, mixed gas of $PH_3$ and $H_2$ with certain ratio is introduced into the PECVD chamber, and a surface reaction occurs on the exposure part of semiconductor a-Si layer in the via holes under properly controlled reaction conditions such as suitable gas ratio, reaction temperature, plasma power, etc. The amorphous silicon is induced to crystallize by $H_2$ plasma and form a μc-Si layer. Moreover, due to the presence of $PH_3$ plasma, P diffuses at the surface and eventually forms a P-doped μc-Si ($n^+$ μc-Si) layer as an ohmic contact layer, which is prepared for the ohmic contact between the pixel electrode layer to be deposited hereafter and the semiconductor layer with the P-doped μc-Si layer.

In the second approach, as shown in FIG. 15B, a high temperature photoresist is used for the mask in step 2, and the photoresist lift-off process is not performed at the end of the process. A P-doped μc-Si layer is directly deposited by PECVD on the resultant substrate, and the photoresist along with the P-doped μc-Si layer thereon is stripped off by photoresist lift-off process, thereby obtaining the same structure as the first approach, which is prepared for the ohmic contact between the pixel electrode layer to be deposited hereafter and the semiconductor layer with the P-doped μc-Si layer.

In the third approach, as shown in FIG. 15C, a high temperature photoresist is used for the mask in step 2, and the photoresist lift-off process is not performed at the end of the process. On the resultant substrate, a $n^+$ a-Si layer is deposited by PECVD and then a very thin Mo (or Cr, W, or alloys thereof) metal layer is deposited. The photoresist along with the $n^+$ a-Si layer and a Mo (or Cr, W, or alloys thereof) metal layer thereon is stripped off by photoresist lift-off process, thereby obtaining the same structure as the above approaches, so as to be ready to establish the ohmic contact between the pixel electrode layer to be deposited hereafter and the semiconductor layer with the $n^+$ a-Si layer and Mo (or Cr, W, or alloys thereof) metal layer.

In Step 4 (S24), after the above steps, the pixel electrode layer and the source/drain electrode metal layer are sequentially deposited by sputtering. The pixel electrode, the source/drain electrode and the data line thus can be obtained with a gray tone mask, in which the partially transparent portion of the mask corresponds to the pixel electrode to be formed, the opaque portion of the mask corresponds to the source/drain electrode and the data line to be formed, and the transparent portion of the mask corresponds to the remaining portion of the substrate, by exposing, developing, and etching.

The source/drain electrode metal layer deposited in this step can be a single layer of Mo, MoW or Cr, and can also be a composite film composed of any combination of Mo, MoW, and Cr.

Figure 11:
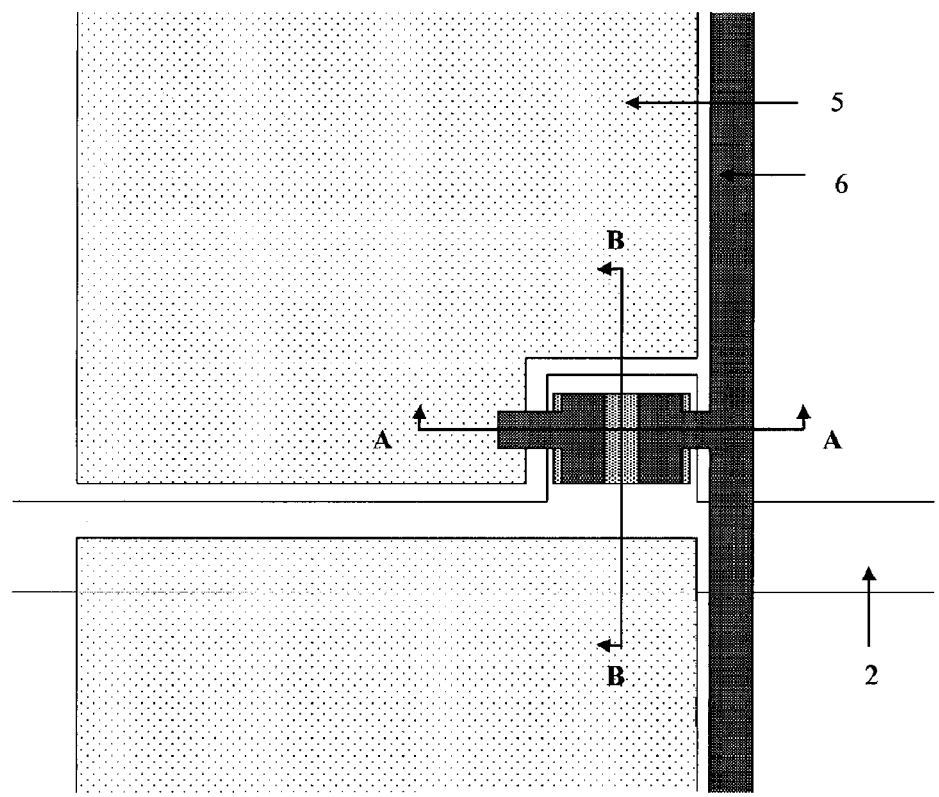
FIG. 11 is a plan view showing a typical pixel unit of a TFT LCD array substrate obtained in accordance with the second embodiment of the present invention.
Figure 12A:
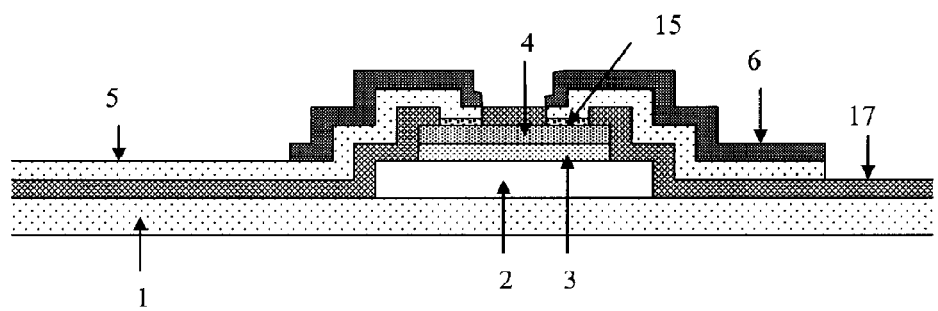
FIG. 12A is a cross-sectional view along the line A-A in FIG. 11.
Figure 12B:
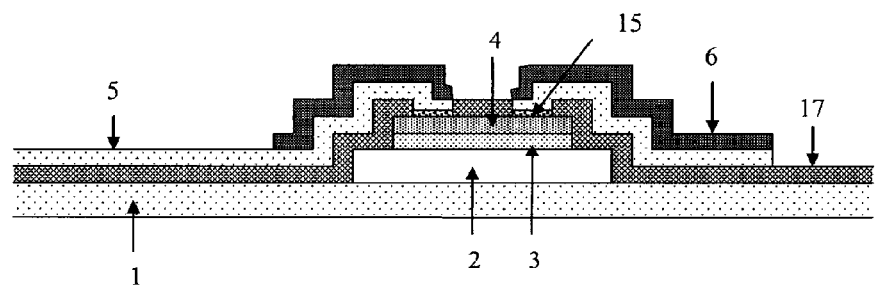
FIG. 12B is a cross-sectional view along the line B-B in FIG. 11.

After completion of the above steps, there is provided a TFT LCD array substrate as shown in FIGS. 11, 12A and 12B, including the gate line and gate electrode 2 formed on the substrate 1, the gate insulating layer 3, and the semiconductor layer 4. Here, an isolating dielectric layer 17 covers the substrate 1, the gate line and gate electrode 2, the gate insulating layer 3, and the semiconductor layer 4. Via holes, in which the ohmic contact layer 15 is deposited, are formed in the isolating dielectric layer 17 on both sides of the semiconductor layer 4. The pixel electrode 5 establishes an ohmic contact with the semiconductor layer 4 via the ohmic contact layer 15 in the via holes. The source/drain electrode is positioned above the pixel electrode 5, and the data line 6 is integrated with the drain electrode.

Besides the P-doped μc-Si material, the ohmic contact layer 15 can be a composite layer composed of $n^+$ a-Si layer and Mo, Cr, W, or alloy metal layers thereof. The gate line and the gate electrode can be a single layer of AlNd, Al, Cu, Mo, MoW or Cr, and can also be a composite film composed of any combination of AlNd, Al, Cu, Mo, MoW, and Cr. The gate insulating layer 3 or the isolating dielectric layer 17 can be a single layer of SiNx, SiOx or SiOxNy, or a composite film composed of any combination of SiNx, SiOx, and SiOxNy. The source/drain electrode or the data line 6 can be a single layer of Mo, MoW or Cr, and can also be a composite film composed of any combination of Mo, MoW, and Cr.

Thereinafter, the preferred example of the manufacturing method of the second embodiment according to the present invention will be described by reference to the accompanying drawings.

The manufacturing method of a TFT LCD array substrate in accordance with the second embodiment of the present invention includes following the steps.

In Step 1 (S21), as shown in FIGS. 13A and 13B, a metal layer such as Mo/AlNd/Mo (400 Å/4000 Å/600 Å) laminate layer is deposited on the substrate 1 (made of glass or quartz) by sputtering. Then SiNx/a-Si layers (5000 Å/1000 Å) are deposited in sequence by PECVD. Then, masking, exposing and developing are performed with a gray tone mask, and reactive ion etching (RIE) is used to form the gate lines and gate electrode 2, the gate insulating layer 3, and the semiconductor layer 4 of the TFT.

In Step 2 (S22), as shown in FIGS. 14A and 14B, an isolating dielectric layer 7, which is a SiNx layer (2000 Å), is deposited on the resultant substrate after step 1 by PECVD. After masking for via holes, a dry etching is used to etch out via holes on both sides of the isolating dielectric layer over the semiconductor layer, through which ITO is connected with a-Si via an ohmic contact layer.

In Step 3 (S23), an ohmic contact layer 15 is formed on the resultant substrate after step 2 with the following approaches.

In the first approach, as shown in FIG. 15A, the mixed gas of $PH_3$ (10000 sccm) and $H_2$ (5000 sccm) is introduced in the PECVD chamber and an surface reaction occurs on the exposure part of a-Si layer in the via holes formed in step 2 under proper temperature (300° C.), chamber pressure (2500 mtorr) and plasma power (3000 W), thereby forming a $n^+$ μc-Si layer (~200 Å).

In the second approach, as shown in FIG. 15B, a high temperature photoresist 9 is used for the mask for via holes in step 2, and after etching the high temperature photoresist 9 is not stripped off. A $n^+$ μc-Si layer (200 Å) is deposited by PECVD, and unwanted portions of the $n^+$ μc-Si layer along with the photoresist is stripped off by photoresist lift-off process, thereby the $n^+$ μc-Si layer only remains in the via holes.

In the third approach, as shown in FIG. 15C, a high temperature photoresist 9 is used for the mask for via holes in step 2, and after etching the high temperature photoresist 9 is not stripped off. A layer of $n^+$ a-Si (200 Å) is deposited by PECVD, a Mo (Cr, W, or alloys thereof) metal layer is deposited by sputtering, and unwanted portion of the $n^+$ a-Si layer and the Mo (Cr, W, or alloys thereof) metal layer along with the photoresist is stripped off by photoresist lift-off process, thereby the $n^+$ a-Si layer and the Mo (Cr, W, or alloys thereof) metal layer only remain in the via holes.

In Step 4 (S24), on the substrate after step 3, an ITO (500 Å) layer and Mo (Cr, W, or alloys thereof) (3000 Å) metal layer are sequentially deposited by sputtering. Then, masking, exposing, developing, and etching are performed with a gray tone mask, to form the pixel electrode 5, the source/drain electrode and data line 6, in which the data line 6 is integrated with the drain electrode, as shown in FIG. 11, 12A and 12B.

The second embodiment of the present invention provides a novel 3Mask method for manufacturing a TFT LCD array substrate, which is different from the existing 5Mask and 4Mask methods. With the inventive 3Mask process, a complete TFT array substrate can be obtained with less process steps, lower production cost and higher yield, and the yield and utilization ratio of the sputter equipment can also be improved.

The second embodiment also only presents a specific solution for realizing the present invention, but the device configuration and the process conditions in this embodiment can be varied, but these variations should not depart from the spirit and scope of sequentially depositing the transparent pixel electrode layer and the source/drain electrode layer and forming the transparent pixel electrode and source/drain electrode with the same gray tone mask. Furthermore, similar to the first embodiment, other methods well known in the art can be utilized to implement the deposition, etching, and the like of the individual layer. Furthermore, in the method of forming the μc-Si contact layer described above, the doped μc-Si layer can also be doped with impurities like arsenic (As) to obtain electrical conductivity.

It should be understood by those skilled in the art that the present invention can be varied and modified without departing from the spirit and scope thereof. Accordingly, the present invention is intended to cover all the changes and modifications as long as they fall within the appended claims and their equivalents.

We claim:

1. A TFT LCD array substrate, comprising:
a substrate and a pixel array on the substrate, each pixel comprising:
a gate line and a gate electrode connected with the gate line formed on the substrate;
a gate insulating layer formed on the gate electrode and a semiconductor layer formed on the gate insulating layer; and
an isolating dielectric layer covering the substrate, the gate line, the gate electrode, the gate insulating layer and the semiconductor layer, wherein via holes, in which an ohmic contact layer is deposited, are formed in the isolating dielectric layer over both sides of the semiconductor layer,
a transparent pixel electrode formed on the isolating dielectric layer and establishing an ohmic contact with the semiconductor layer via the ohmic contact layer in the via holes, and
a source electrode, a drain electrode and a data line, which are formed on the transparent pixel electrode.

2. The TFT LCD array substrate according to claim 1, wherein the ohmic contact layer is a μc-Si layer.

3. The TFT LCD array substrate according to claim 1, wherein the ohmic contact layer is a composite layer composed of a μc-Si material or $n^+$ a-Si layer and Mo, Cr, W, or alloy metal layers thereof.

4. The TFT LCD array substrate according to claim 1, wherein the data line and drain electrode is integrated with each other.

5. A TFT LCD array substrate comprising a substrate and a pixel array on the substrate, each pixel comprising:
a thin film transistor formed on the substrate, wherein the thin film transistor includes a gate line and a gate electrode connected with the gate line formed on the substrate, a gate insulating layer formed on the gate electrode, a semiconductor layer, and an ohmic contact layer formed on at least two ends of the semiconductor layer;
a transparent pixel electrode formed on the thin film transistor, electrically insulated from the gate electrode and the gate line, and electrically contacted with the two ends of the semiconductor layer respectively via the ohmic contact layer;
a source/drain electrode and a data line formed on the transparent pixel electrode and electrically connected with the semiconductor layer via the transparent pixel electrode;
an isolation dielectric layer formed on the gate electrode, the gate line, the gate insulating layer and the semiconductor layer, wherein the transparent pixel electrode layer is insulated from the gate line and gate electrode via the isolating dielectric layer, and via holes, in which an ohmic contact layer is deposited, formed on both sides of the isolating dielectric layer over the semiconductor layer.

6. The TFT LCD array substrate according to claim 5, further comprising a passivation layer covering the transparent pixel electrode, the source/drain electrode and the data line.

7. The TFT LCD array substrate according to claim 5, wherein the ohmic contact layer is a μc-Si layer.

8. The TFT LCD array substrate according to claim 5, wherein the ohmic contact layer is a composite layer composed of a μc-Si material or $n^+$ a-Si layer and Mo, Cr, W, or alloy metal layers thereof.

9. The TFT LCD array substrate according to claim 5, wherein the data line and drain electrode is integrated with each other.

* * * * *